(12) United States Patent
Lefferts et al.

(10) Patent No.: US 8,976,497 B2
(45) Date of Patent: Mar. 10, 2015

(54) PREVENTING ELECTROSTATIC DISCHARGE (ESD) FAILURES ACROSS VOLTAGE DOMAINS

(75) Inventors: Robert B. Lefferts, Portland, OR (US); Peter C. de Jong, Oosterbeek (NL); Roland G. de Jonge, Eindhoven (NL)

(73) Assignee: Synopsys, Inc., Mountain View, CA (US)

( * ) Notice: Subject to any disclaimer, the term of this patent is extended or adjusted under 35 U.S.C. 154(b) by 351 days.

(21) Appl. No.: 13/477,971

(22) Filed: May 22, 2012

(65) Prior Publication Data

US 2013/0314824 A1    Nov. 28, 2013

(51) Int. Cl.
*H02H 9/04*    (2006.01)
*H01L 27/02*   (2006.01)
*H02H 3/02*    (2006.01)

(52) U.S. Cl.
CPC .............. *H02H 9/04* (2013.01); *H01L 27/0251* (2013.01); *H02H 3/02* (2013.01)
USPC ........................................................... 361/56

(58) Field of Classification Search
CPC ............. H02H 3/04; H02H 9/04; H02H 3/02; H01L 27/0251
See application file for complete search history.

(56) References Cited

U.S. PATENT DOCUMENTS

| | | | | |
|---|---|---|---|---|
| 6,011,681 | A * | 1/2000 | Ker et al. | 361/111 |
| 6,075,686 | A * | 6/2000 | Ker | 361/56 |
| 6,144,542 | A | 11/2000 | Ker et al. | |
| 7,110,228 | B2 * | 9/2006 | Chang | 361/56 |
| 7,233,467 | B2 * | 6/2007 | Mergens et al. | 361/56 |
| 7,352,547 | B2 * | 4/2008 | Okushima | 361/56 |
| 7,692,907 | B2 | 4/2010 | Chen et al. | |
| 7,768,350 | B2 | 8/2010 | Srinivasan et al. | |
| 7,869,174 | B2 | 1/2011 | Tanaka et al. | |
| 2001/0045571 | A1 | 11/2001 | Gandhi et al. | |
| 2009/0097174 | A1 | 4/2009 | Ker et al. | |
| 2009/0135534 | A1 | 5/2009 | Ishii | |
| 2011/0063763 | A1 | 3/2011 | Alvarez et al. | |
| 2012/0154962 | A1 | 6/2012 | Russ et al. | |

OTHER PUBLICATIONS

Archive of Chen, et al., "A CMOS Standard-Cell Library for the PC-Based LASI Layout System," The University of Idaho Center in Boise, Sep. 25, 2010, 4 pages, [Online] [Archived by http://archive.org on Sep. 25, 2010; Retrieved on Sep. 29, 2013] Retrieved from the Internet:<URL:http://web.archive.org/web/20100925153656/http://cmosedu.com/jbaker/papers/1998/MW981.pdf>.

PCT International Search Report and Written Opinion, PCT Application No. PCT/US2013/041580, Oct. 10, 2013, 15 pages.

* cited by examiner

*Primary Examiner* — Zeev V Kitov
(74) *Attorney, Agent, or Firm* — Fenwick & West LLP (57) ABSTRACT

An electrostatic discharge (ESD) device implemented within a power domain to mitigate ESD events imparted from another power domain for reducing integrated circuit (IC) failures. A first power domain includes an interface where ESD events are received and an output that can impart ESD event voltages on other components. A second power domain includes an ESD device coupled to the output of the first power domain and a protected IC. In one embodiment, the ESD device includes a floating device with an input terminal coupled to the interface output. By floating the device receiving the ESD event in the second power domain, damaging ESD induced voltages are reduced. Embodiments of the ESD device can be implemented using standard cell libraries to simplify integration.

25 Claims, 10 Drawing Sheets

PREVENTING ELECTROSTATIC DISCHARGE (ESD) FAILURES ACROSS VOLTAGE DOMAINS

BACKGROUND OF THE INVENTION

1. Field of the Disclosure

The present disclosure relates to electrostatic discharge and more specifically to mitigating the effects of electrostatic discharges to prevent device failures.

2. Description of the Related Art

Electrostatic discharge (ESD) events are serious issues concerning the longevity and durability of integrated circuits (ICs). ESD events are caused by the familiar buildup and discharge of charges due static electricity and also through electrostatic induction, which occurs when a conductive object is exposed to an electric field. The electric field causes the distribution of charges on the conductive object to become uneven, thereby concentrating like charges which are subsequently discharged to cause an ESD event.

ICs include semiconductor materials such as silicon and insulating materials such as silicon dioxide that are patterned or deposited in specific ways to enable a given function. If either of these materials suffers damage, such as due to an ESD event, the functionality of the IC may cease to exist. Accordingly, ESD prevention devices are typically implemented within the IC's power/ground domain (herein "power domain") for handing such ESD events.

However, with the advancement of IC designs, many System-on-chips (SoCs) and other IC implementations oftentimes involve multiple subsystems and interfaces that operate in separate power domains. For example, a power domain with a 3.3V rail may service a processing core while another power domain with a 5V rail may service a Universal Serial Bus (USB) interface. In order to receive data from the interface, the processing core and interface are coupled, thereby creating a power domain boundary. Although existing ESD devices can mitigate ESD events within separate, single power domains, some ESD events are imparted from one power domain into another and subsequently cause IC failures at power domain boundaries.

SUMMARY

Embodiments relate to an ESD device in a first power domain for mitigating ESD events imparted from another power domain to reduce integrated circuit failures. The ESD device includes standard cell components in the first power domain configured to mitigate ESD events imparted by components in other power domains. A first standard cell component is coupled to first voltage rails in the first power domain. The first standard cell component include a floating device with a gate operatively coupled to an output of a component in a second power domain via a first input terminal. A second input terminal of the first standard cell is coupled to the floating device and a second standard cell is coupled to the second input terminal to enable change of drain voltage or source voltage of the floating device in response to a change in voltage at the output of the component. The second standard cell is also coupled to the first voltage rails.

Embodiments also relate to an ESD device in a first power domain that includes a floating device with a signal input terminal coupled to an interface output where the interface is in a second power domain. The signal input terminal of the ESD device receives ESD event induced voltage changes outside operating voltages from the interface. When the ESD device receives an ESD inducted voltage change at the signal input terminal, the voltage potential of the input terminal of the floating device may increase relative to a source or drain terminal of the floating device. The drain and source terminals of the floating device are floated such that their voltage is free to increase or decrease with the change in voltage at the signal input terminal, thereby regulating the voltage potential from the input terminal to the drain or source terminal to a safe level for preventing ESD failures.

Embodiments also relate to preventing failure of an integrated circuit from an ESD event. A first voltage change caused by an ESD event is received at a first voltage rail of an interface within a first power domain. Components within the first power domain are powered by the first voltage rail. In a second power domain having components powered by a second voltage rail, a second voltage change caused by the ESD event is received at a gate terminal of a floating device within the second power domain. In response to the second voltage change at the gate terminal of the floating device, a third voltage change is induced at a second terminal of the floating device to reduce a voltage potential between the gate terminal and the second terminal.

BRIEF DESCRIPTION OF THE DRAWINGS

The teachings of the embodiments can be readily understood by considering the following detailed description in conjunction with the accompanying drawings.

DETAILED DESCRIPTION OF EMBODIMENTS

The Figures (FIG.) and the following description relate to preferred embodiments by way of illustration only. It should be noted that from the following discussion, alternative embodiments of the structures and methods disclosed herein will be readily recognized as viable alternatives that may be employed without departing from the principles of the embodiments.

Reference will now be made in detail to several embodiments, examples of which are illustrated in the accompanying figures. It is noted that wherever practicable, similar or like reference numbers may be used in the figures and may indicate similar or like functionality. The figures depict embodiments for purposes of illustration only.

Embodiments relate to an electrostatic discharge (ESD) device within a power domain for mitigating ESD events imparted from another power domain to reduce integrated circuit (IC) failures. Embodiments of the ESD device are further configured to enable implementation with standard cells. In one embodiment, a first power domain includes an interface where ESD events are initially received. A second power domain includes the ESD device and a protected IC (e.g., a processing core). The ESD device includes a floating device with a signal input terminal coupled to the interface output. The signal input terminal of the ESD device receives both data signals within operating voltages and ESD event induced voltage changes outside operating voltages from the interface. When the ESD device receives an ESD inducted voltage change at the signal input terminal, the voltage potential of the input terminal of the floating device may increase relative to a source or drain terminal of the floating device. Too great of a potential between the input terminal and the source or drain, and the floating device may suffer permanent damage or fail completely. By floating the drain and source terminals, their voltage is free to rise or fall (i.e., float) with the change in voltage at the signal input terminal, thereby regulating the voltage potential from the input terminal to the drain and source terminals to a safe level and preventing ESD failures. By leveraging existing standard cells for construction of the ESD device, existing electronic design automation (EDA) tools can be used for design and/or validation of SoCs implementing the ESD device.

As referred to herein, a standard cell component a group of transistor and/or interconnect structures that can be instantiated during a design stage of an integrated circuit (IC) using information available from a standard cell library. In some embodiments, the groups of transistors and/or interconnects within a standard cell component can be configured to provide a logic function (e.g., AND, NAND, OR, XOR, NOT, etc.) or storage function (e.g., flipflop or latch) with inputs (e.g., power, ground and/or signals) and outputs based thereon.

As referred to herein, a "floating device" is a transistor structure with a gate terminal that has a floating source, drain and/or well terminals.

Figure 1:
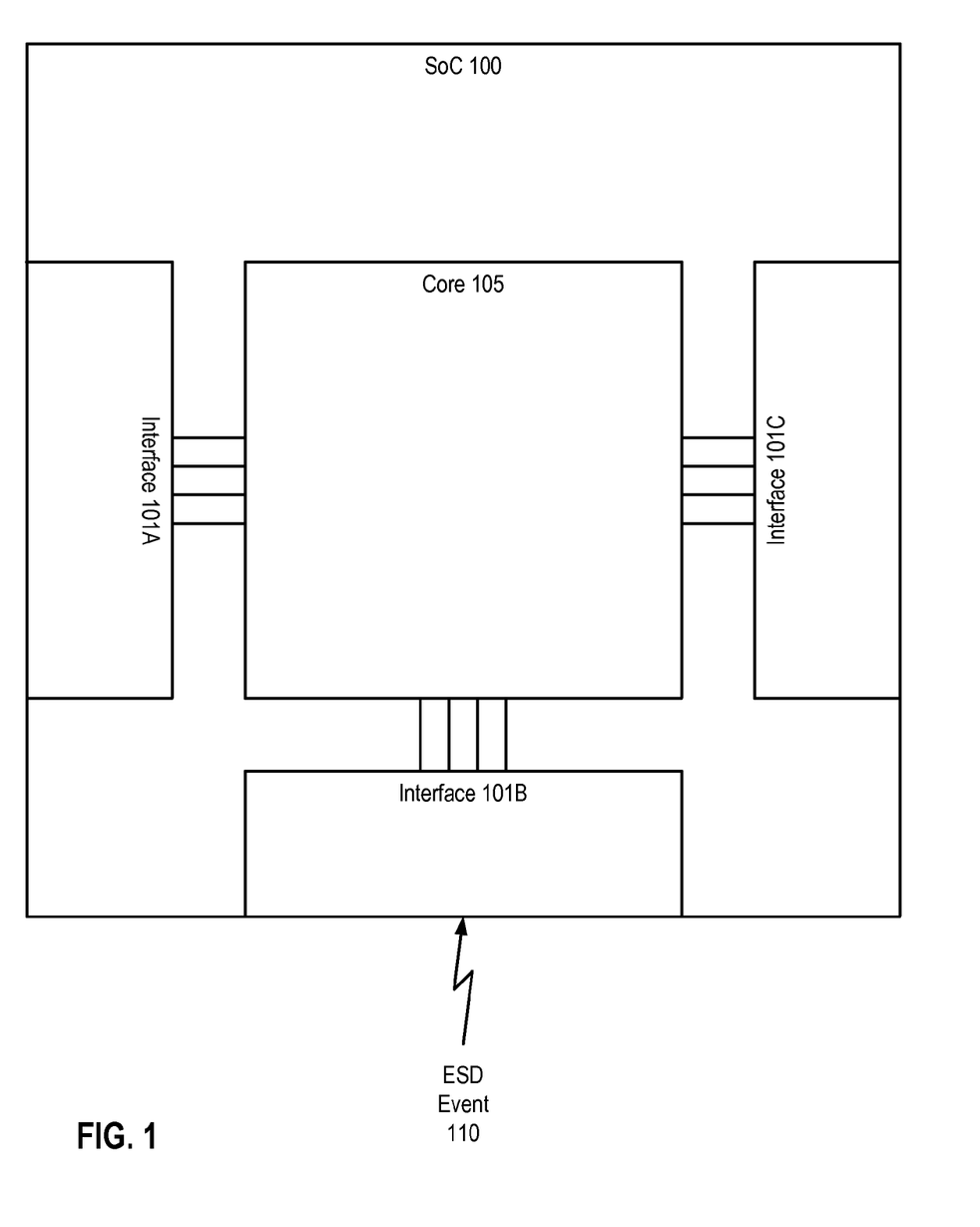
FIG. 1 is a block diagram illustrating a system-on-chip according to one embodiment.

FIG. 1 is a block diagram illustrating a system-on-chip (SoC) 100 according to one embodiment. As shown, the SoC 100 includes a processing core 105 and several interfaces 101A through 101C (hereinafter collectively referred to as "the interfaces 101") coupled to the core 105. In other embodiments, the SoC 100 may include additional components in addition to the core 105 and interfaces 101 such as a memory or system controller (not shown).

The processing core 105 receives signals from the interfaces 101 or other components not illustrated in FIG. 1. Each of the interfaces 101 may represent a universal serial bus (USB), firewire, Peripheral Component Interconnect (PCI), Small Computer System Interface (SCSI) or other suitable input/output (I/O) interface for exchanging signals with the core 105. The data exchanged between an interface 101 and the core 105 may be bi-directional or uni-directional (e.g., the interface does not receive data).

FIG. 1 also illustrates an ESD event 110 at interface 101B. One common example resulting in ESD event 110 includes a person or peripheral discharging a buildup of charge into the interface. In another example, ESD event 110 may result from the interface discharging charge into a person or peripheral. In such instances, ESD event 110 may cause serious damage to SoC 100 components such as core 105 which is coupled to the interface 101B.

Figure 2:
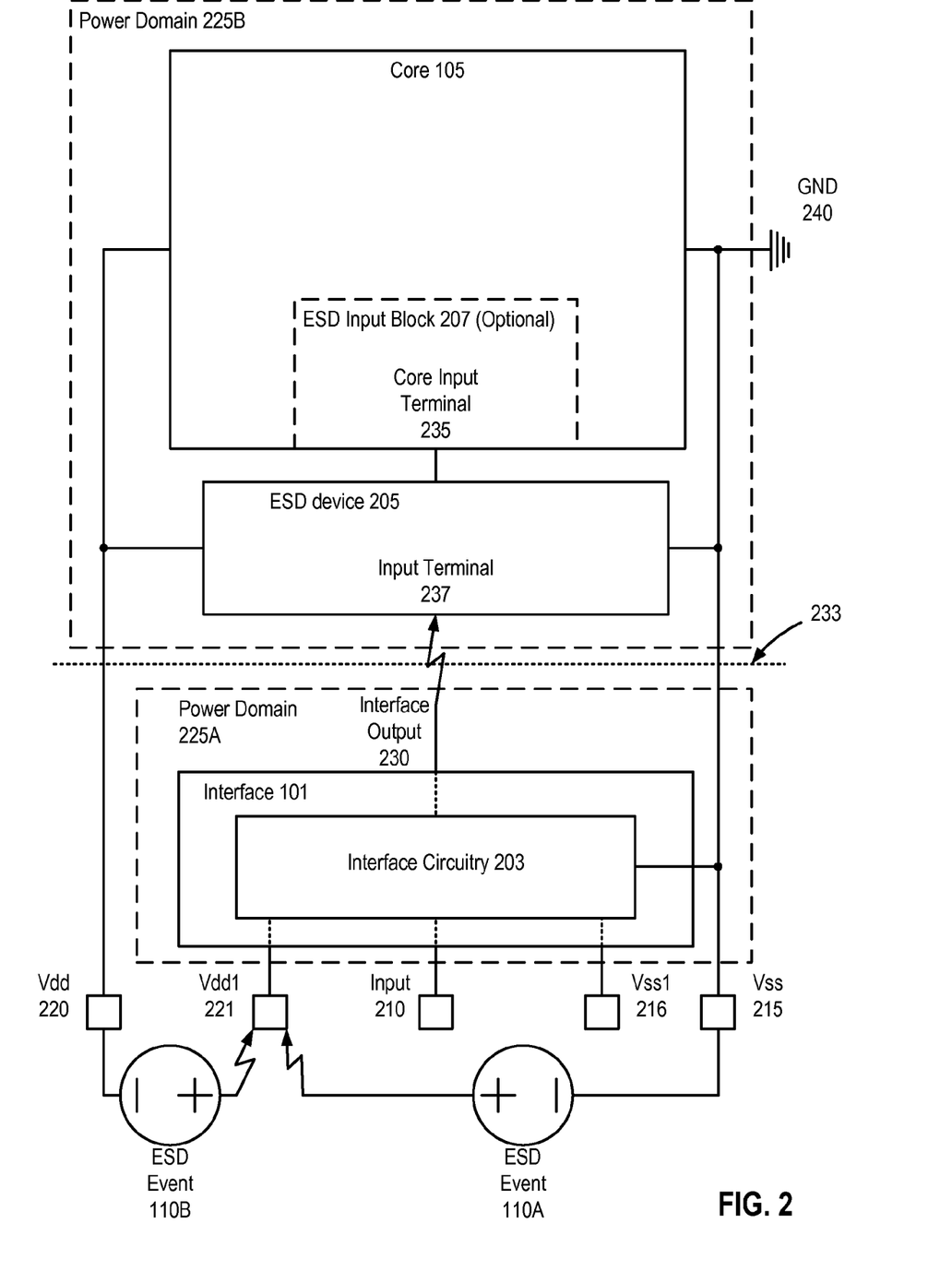
FIG. 2 is a block diagram illustrating an example of an ESD device for mitigating ESD events across power domain boundaries, according to one embodiment.

In order to prevent damage to SoC 100 components in different power domains during cross domain ESD events 110, an ESD device is implemented between the interface 101 and the protected component. FIG. 2 illustrates an example placement of an ESD device 205 for mitigating the effect of ESD events across power domain boundary 223. While FIG. 2 illustrates the ESD device 205 as a standalone block between interface output terminal 230 and core input terminal 235, SoC 100 components themselves may alternatively include the ESD device within an input block 207.

FIG. 2 illustrates the power domain boundary 233 of power domains 225A and 225B. Power domain 225A may include, among other components, an interface 101 with circuitry 203 coupled to interface supply lines Vdd1 221 and Vss1 216 (positive and negative/ground supply, respectively), interface input terminal 210 and interface output terminal 230. Vdd1 221 and Vss1 216 power the interface circuitry 203 and/or connected peripherals. The input terminal 210 receives incoming data, which the interface circuitry 203 outputs via the interface output 230 for processing at the core 105.

The interface circuitry 203 may also be coupled to a negative supply/ground line Vss 215 shared with multiple SoC 100 components. In the illustrated embodiment, for example, the components in multiple power domains 225 are coupled to a common ground 240 through Vss 215.

Power domain 225B may include, among other components, an ESD device 205 and the core 105. The ESD device 205 has an input signal terminal 237 coupled to the interface output 230 for receiving data signals from the interface 101. The ESD device 205 is further coupled to the main supply lines Vdd 220 and Vss 215 (i.e., positive and negative/ground supply, respectively) and to the core input terminal 235. The ESD device 205 passes signals received from the interface circuitry 203 at its input 237 to the core input terminal 235.

FIG. 2 also shows two example ESD events 110A and 110B which respectively illustrate a potential difference measured at Vdd1 221 with respect to Vss 215 and a potential difference measured at Vdd1 221 with respect to Vdd 220. Other embodiments consider ESD events 110 at other terminals and measurements with respect to other terminals or sources. For example, an ESD event 110 may result from discharging a capacitor into Vdd1 221 and the potential measured at Vdd1 221 with respect to Vdd 220 or Vss 215. However, discussion of each permutation with respect to the ESD device's 205 functionality is duplicative and omitted for clarity.

ESD events 110A and 110B are received at Vdd1 221 and conducted by the interface circuitry 203. The ESD events 110 may cause a voltage change at the output terminal 230 of the interface 101 that couples to an input terminal (e.g., 235 or 237) of an IC within power domain 225B. In one embodiment, the voltage change is applied at the input terminal 237 of an ESD device 205 within the power domain 225. The ESD device 205 intercepts the voltage spike due to ESD event 110 and prevents damage that would otherwise occur at the input terminal 235 of the core 105 (assuming no ESD input block 207). In addition to intercepting the voltage spike due to the ESD event 110 before the core 105, the ESD device 205 itself mitigates the effects of the ESD event 110 at its input terminal 237 to prevent damage that would otherwise disrupt passage of input signals during normal operation. In this way, the ESD device 205 prevents IC failures on the SoC 100.

Figure 3:
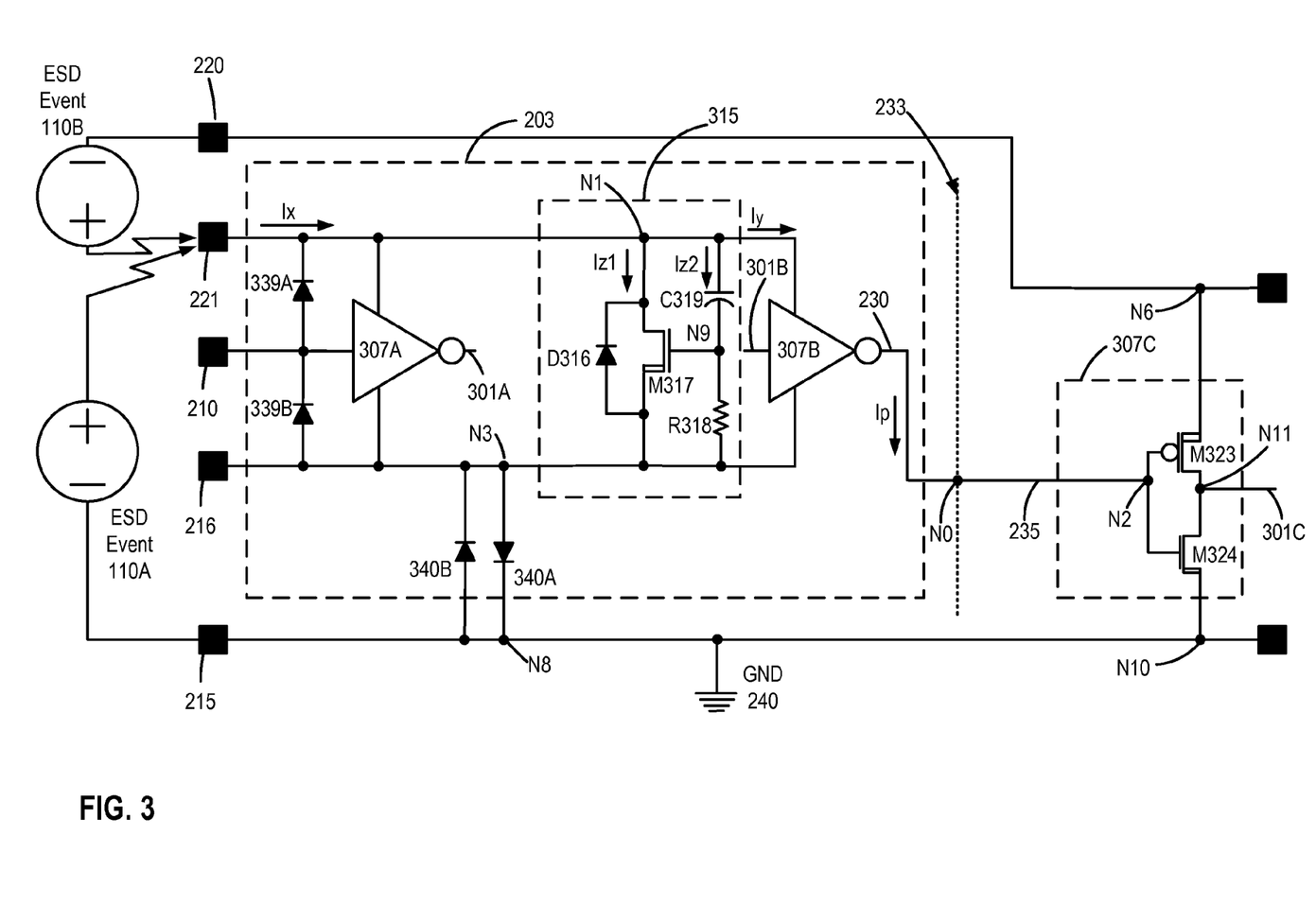
FIG. 3 is a circuit diagram illustrating an example ESD event at a power domain boundary, according to one embodiment.

FIG. 3 is a circuit diagram illustrating an example ESD event 110 at a power domain boundary 233, according to one embodiment. FIG. 3 shows an example embodiment of interface circuitry 203 on a SoC 100 and the input terminal 235 with corresponding input circuitry 307C of a SoC component (e.g., core 105) without ESD protection. The interface circuitry 203 includes an output terminal 230 coupled to the input terminal 235 at node N0, which represents the power domain boundary 233.

The interface circuitry 203 may include, among other components, local ESD structures including input diodes 339A and 339B, anti-parallel diodes 340A and 340B and ESD clamp 315 and signal components including inverters 307A and 307B. One embodiment of the ESD clamp 315 includes a transistor M317, blocking diode D316, capacitor C319 and resistor R318. The local ESD structures protect the interface signal components 307A and 307B from ESD events 110 within its power domain 225A but do not prevent inverter 307B from causing a change in voltage at node N0 due to the ESD event which affects power domain 225B.

In one embodiment, the input circuit 307C of the SoC 100 component is an inverter that includes transistors M323 and M324. When implemented in CMOS, transistors M323 and M324 are respectively implemented as an "active low" p-type metal-oxide-semiconductor field-effect transistor (pMOS) and an "active high" n-type metal-oxide-semiconductor field-effect transistor (nMOS). In CMOS, active low transistors are "ON" (i.e., in a conducting state) when their gate terminals are logic 0 or "low" (e.g., ground). Active high transistors are "ON" when their gate terminals are logic 1 or "high" (e.g., supply Vdd or Vdd1).

The gate terminals of M323 and M324 are coupled at node N2 which forms the input terminal 235 of the SoC 100 component. The drain terminals of M323 and M324 are coupled to form signal line 301C which passes inverted versions of signals received at the input terminal 235 to the SoC 100 component. The sources of M323 and M324 are respectively coupled to power (Vdd 220) and ground (Vss 215) lines. Thus, when the transistors M323, M324 are in their "ON" states, they substantially conduct and effectively couple signal line 301C to either Vdd 220 or Vss 215. Selectively coupling the signal line 301C to Vdd 220 and Vss 215 respectively generates high "Vdd" and low "Vss" input signals for the SoC 100 component.

Inverters 307A and 307B may include components configured similar to those (e.g., M323 and M324) of input circuitry 307C. The inverters 307 are coupled to power (Vdd1 221) and ground (Vss1) to generate high "Vdd1" and low "Vss1" signals at their outputs.

Inverter 307A receives input signals (e.g., X) from the interface 101 input terminal 210 and passes inverted versions (e.g., $\overline{X}$) of the input signal along output 301A, which, in one embodiment, can be coupled to the input 301B of inverter 307B. In other embodiments, other logic may exist in between the output 301A and the input 301B of the inverter 307B. In such cases, signals received at the input may be a derivative of $\overline{X}$ or a function of multiple input signals. Assuming, for example, that output 301A is coupled directly to input 301B, the inverter 307B, in turn, inverts the signal, $\overline{X}$, and passes signal X' (X prime) to the interface output 230. In one embodiment, signal X' is electrically isolated from signal X, but carries the same data during normal operation. Due to their electrical isolation, the voltage level between X' and X may differ due to ESD events 110 and other power source fluctuations. For example, because the inverter 307B selectively couples the interface output 230 to Vdd1 221 and Vss1 216 to generate the high and low values of X', the voltage at the interface output 230 fluctuates between the voltages of Vdd1 for "high" signals and Vss1 for "low" signals whereas the voltage at the input terminal 210 may be driven by other voltage sources.

Consider, for example, inverter 307A in a state where line 301A is coupled to Vss1 216 and thus, drives the signal on 301A "low" to the voltage of Vss1. Inverter 307B receives the voltage of Vss1 at its input 301B and, in turn, drives the interface output 230 "high" to the voltage of Vdd1 by coupling the output terminal 230 to Vdd1 221. As the output terminal 230 is coupled to node N0, inverter 307B also drives node N0 "high" to the voltage of Vdd1 221 at the power domain boundary 233. During typical operation, the Vdd1 221 voltage remains within the voltage levels tolerated by the input circuitry 307C. In the case of an ESD event 110 at Vdd1 221, the inverter 307B drives the voltage at node N0 towards the voltage of Vdd1 (e.g., the ESD voltage). The change in voltage at node N0 causes a change in voltage at the input terminal 235 of the input circuitry 307C. In turn, node N2 rises to the voltage of the input terminal 235. A voltage over a certain level at node N2 will degrade the transistors M323, M324, as explained in further detail below with reference to FIG. 3 during an ESD event 110.

The ESD event 110 at Vdd1 221 induces an ESD voltage along Vdd1 and causes an ESD current Ix from Vdd1 221. Input diode 339A prevents current Ix from flowing to the input terminal 210. As explained previously, the output 301A of inverter 307A is coupled to Vss1 (driven low) when the signal, X, on input 210 is high. Accordingly, Vdd1 221 substantially conducts current Ix to node N1. At node N1, the local ESD structure 315 substantially conducts current Ix from Vdd1 221 to Vss1 216.

Current through the local ESD clamp 315 includes Iz1 conducted via transistor M317 when node N9 is high and Iz2 that is induced while capacitor C319 is being charged. If the voltage at node N1 rises, so does the voltage across the capacitor C319. The current Iz2 results from the well known equation $I(t)=C*dV(t)/dt$ where the current, I, at time t is equal to the capacitance, C, of C319 times the derivative of voltage, V, across the capacitor (i.e., potential difference from node N1 and node N9) with respect to time. During charging of the capacitor C319, current Iz2 through resistor R318 causes the voltage at node N9 to increase. Resistor R318, in conjunction with capacitor C319, form an RC voltage divider with an output at node N9. The capacitance value of capacitor C319 and the resistance of resistor R318 are selected according to the desired timing characteristics (e.g., according to well known RC analysis) and voltages used at the interface 101, which are well known in the art.

As shown in FIG. 3, the local ESD clamp 315 includes an active high nMOS transistor M317 with its gate coupled to node N9. Thus, the voltage rise at N9 during the ESD event 110 causes transistor M317 to begin conducting current Iz1 to node N3 and then to ground 240 via Anti-Parallel diode 340A and node N8. Current Iz1 through diode 340A causes a drop in voltage from node N3 to N8 due to the forward voltage of the diode. In one embodiment, the voltage drop ranges from 0.7V for p-n silicon diodes to 0.2V for Schottky diodes during normal operation. During an ESD event 110, while the forward voltage drop across the diode 340A may increase to 2V to 3V for Iz1's on the order of an Ampere, the input circuitry 203 can tolerate these voltage levels. In this way, the local ESD clamp 315 protects the input circuitry 203 from a voltage spike due to the ESD event 110.

In practice, however, the voltage on Vdd1 221 may remain high (e.g., at or near the ESD voltage or a voltage level sufficient to cause oxide damage) even though the input circuitry 203 is unaffected. When the voltage at node N9 rises above the threshold voltage required for transistor M317 to transition from its OFF state to the ON state, ESD structure 315 conducts current Iz1 caused by the ESD event 110. With transistor M317 conducting current in the ON state, resistance between the drain and source of transistor M317 causes a voltage drop from Vdd1 221 to Vss1 216. As a result of the ESD structure 315 conducting current Iz1's on the order of an Ampere via transistor M317 during ESD events 110, forward voltage drops also occur across diode 340A from the ground rail Vss1 216 to Vss 215 and across conducting portions of the Vss1, Vss rails due to the rails' electrical resistance. With smaller processes, the voltage drop across conducting portions of the Vss rails, 215, 216 may increase due to smaller cross-sectional areas. The combination of these forward voltage build-ups during ESD events 110 result in high, ESD induced, Vdd 221 voltages, which may be measured as the sum of the forward voltage drops across transistor M317, diode 340A and the portions of the Vss 216, Vss1 215 rails conducting current (e.g., Iz1 and Iz2) to ground 240. If the inverter 307B couples the interface output 230 to Vdd1 221 while the voltage on Vdd1 remains high, the input circuitry 307C of the SoC 100 is subjected to the high voltage caused by the ESD event 110. The change in voltage at node N2 can result in the increase of potential measured from the gate-drain or gate-source of the transistors M323, M324 (e.g., from node N2 to node N6, N10 and/or N11). If the potential difference is greater than a limit, a gate breakdown current Ip from the interface output 230 flows into transistors M323 and/or M324 which degrades, if not destroys, their gate oxides. Inverter 307B provides the gate breakdown current Ip via the output terminal 230 by conducting a portion Iy of the ESD current Ix.

Figure 4A:
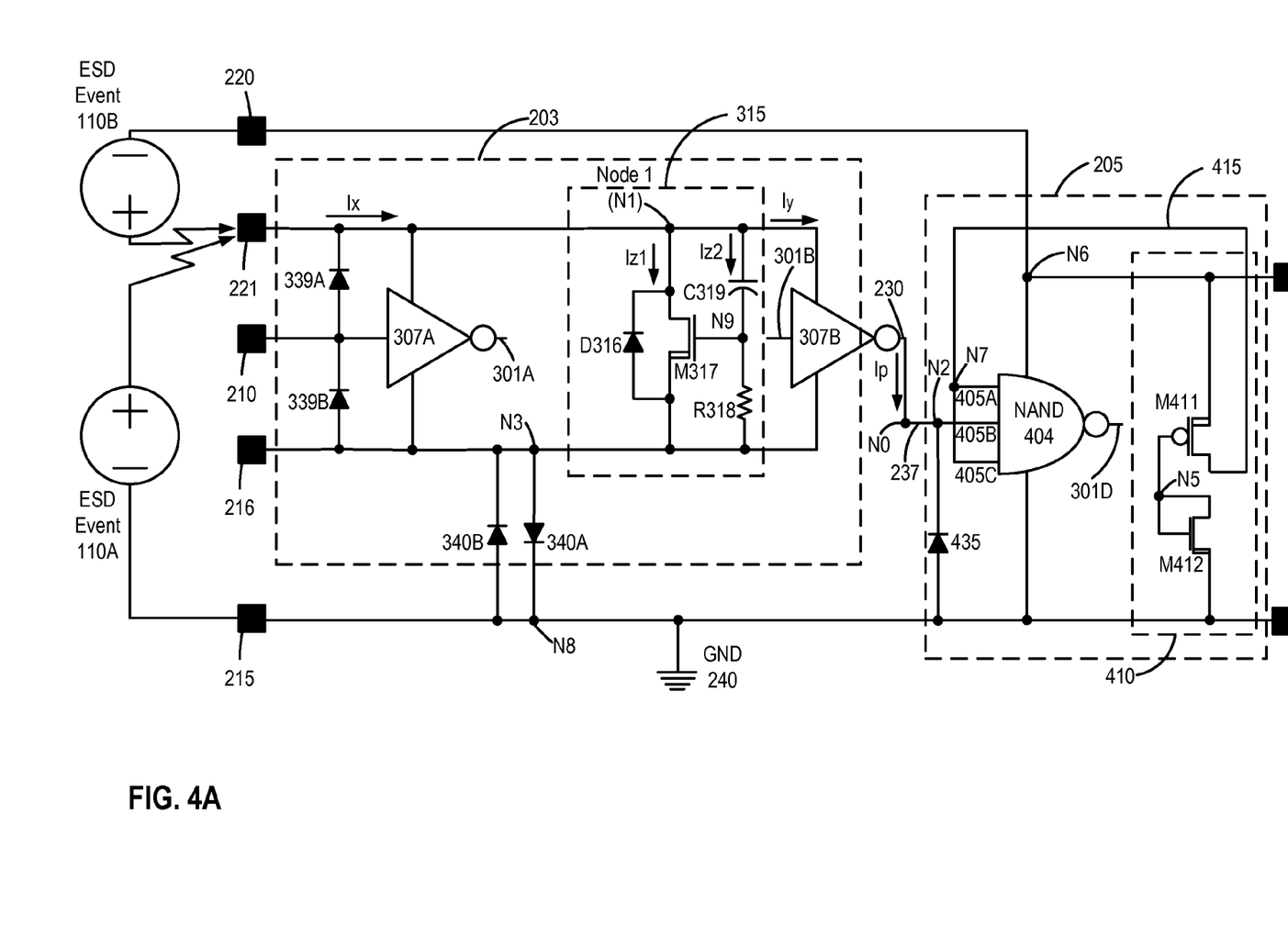
FIG. 4A is a circuit diagram illustrating an example configuration of standard cell components as an ESD device at a power domain boundary, according to one embodiment.

FIG. 4A is a circuit diagram illustrating an example configuration of standard cell components 404, 410, 435 as an ESD device 205 at a power domain boundary, according to one embodiment. As shown in FIG. 4A, ESD device 205 replaces the input circuitry 307C illustrated in FIG. 3 for receiving signals from the interface output 230. The ESD device 205 includes a negated AND (NAND) gate 404, tie-high 410 and antenna diode 435. These elements of the ESD device 205 are commonly available in standard cell libraries.

In one embodiment, the NAND gate 404 includes three input terminals 405A through 405C (3-NAND) and an output terminal 301D. Its power and ground terminals are respectively coupled to Vdd 220 and Vss 215. In other embodiments, the NAND gate 404 includes additional input terminals (e.g., 5 input terminals for a 5-NAND). Like inverter 307C, the output terminal 301D of the NAND 404 is selectively coupled to Vdd 220 or Vss 215 to generate high and low signals for the SoC 100 component. In the illustrated configuration, the terminals 405A through 405C of the NAND 404 are configured such that output terminal 301D passes an inverted version of the signal received at terminal 405B to the SoC 100 component (e.g., at input terminal 235). Terminal 405B is coupled to the ESD device 205 input terminal 237 at node N2. The input terminal 237 is coupled to node N0 at the power domain boundary. Antenna diode 435 is coupled between node N2 and Vss 215 and is explained below in more detail with reference to FIG. 4B. Terminals 405A and 405C are coupled to the output terminal 415 of the tie-high 410 at node N7.

The tie-high 410 outputs the logical "high" voltage of Vdd 220 at output 415 when powered, and thus biases node N7 to the voltage of Vdd 220. However, as opposed to directly coupling node N7 to the voltage of Vdd 220, the tie-high 410 provides a high impedance path through capacitive coupling, which is explained in greater detail below with reference to FIG. 4B.

In one embodiment, the tie-high 410 consists of a pMOS transistor M411 and nMOS transistor M412. The source of transistor M411 is coupled to Vdd 220 and its drain forms the tie-high output 415. As pMOSs are active low, the gate of transistor M411 is coupled to a pull down node N5. Thus, during normal operating conditions, as the nMOS transistor M412 has its gate and drain coupled to node N5, pulls N5 to Vss 215. During ESD events however, the tie-high 410 holds node N7 low due to a large capacitive load from the tie-high 410. Specifically, in one embodiment, there are many (e.g., hundreds or thousands) of components or blocks within the power domain that receive the tie-high 410 output signal. Together, these components create a large capacitive load at node N7. In combination with a weak (e.g., small) pull-up pMOS 411, the capacitive load causes N7 to remain low throughout the duration ESD event 110 (e.g., on the order of nanoseconds). In some embodiments, other or additional capacitive loads such as dedicated gate oxide capacitors may be added to increase the capacitive load at node N7.

As described above with reference to FIG. 3, inverter 307B can drive node N0 high during an ESD event 110 and substantially expose the input terminal 237 to the ESD voltage at Vdd1 221. Too high of a voltage and the input circuitry 307C begins degrading, allowing the conduction of a gate breakdown current Ip as the result of electrons passing through the gate insulation of a transistor (e.g., due to too great a gate-source or gate-drain potential difference). The ESD device 205 mitigates this potential difference and thus prevents the flow of electrons and resulting gate breakdown current Ip.

Figure 4B:
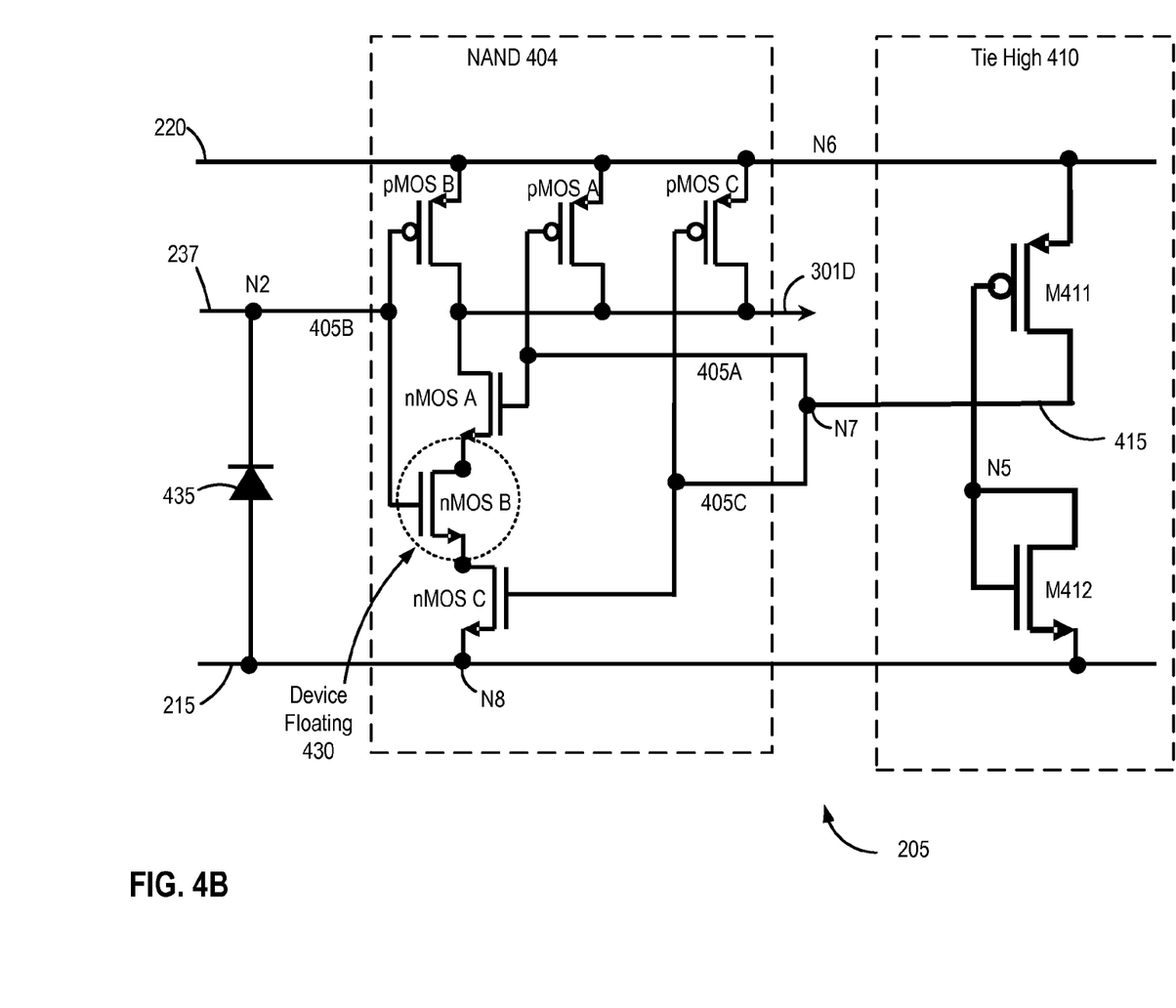
FIG. 4B is a circuit diagram illustrating an example configuration of an ESD device at a power domain in complementary metal-oxide-semiconductor (CMOS) architecture, according to one embodiment.

FIG. 4B is a circuit diagram illustrating an example configuration of an ESD device 205 at a power domain 233 in complementary metal-oxide-semiconductor (CMOS) architecture, according to one embodiment. As shown, the 3-NAND 404 includes pMOS transistors (i.e., pMOS A through pMOS C) arranged in parallel with their sources coupled to Vdd 220 and drains coupled to the output terminal 301D. The complimentary nMOS transistors (i.e., nMOS A through nMOS C) are thus arranged serially. Specifically, the drain and source of nMOS A are respectively coupled to output 301D and the drain of nMOS B and the drain and source of nMOS C are respectively coupled to the source of nMOS B and node N8. Thus, as shown in FIG. 4B, nMOS B is a middle transistor in an nMOS stack. While the illustrated embodiment includes only three stacked nMOS transistors, additional nMOS transistors may be added to the top or bottom of the stack with additional (optional) pMOS transistors added in parallel with pMOS A, pMOS B and pMOS C.

The gate terminals of pMOS B and nMOS B are coupled and collectively form input terminal 405B which is coupled to node N2. In a similar fashion, the gates of the other MOSs form terminals 405A and 405B which are coupled at node N7 to the tie-high output 415. In embodiments including additional nMOSs in the stack (and corresponding pMOS transistors in CMOS), their gates are coupled at node N7 in a similar fashion.

Rather than coupling a resistor-capacitor based circuit(s) to the input terminal 237, which introduces signal timing delays and often requires a large footprint, a single antenna diode 435 is implemented. The antenna diode 435 does not affect the timing of the input signal. The forward drop voltage of the antenna diode 435 is a selectable design parameter and provides adequate protection for the pMOS devices, which are, in general, less susceptible to oxide damage than their nMOS counterparts.

As shown, the input terminal 237 and the cathode of antenna diode 435 are coupled at node N2. The anode of antenna diode 435 is coupled to Vss 215. The orientation of the antenna diode 435 prevents the flow of current between node N2 and Vss 215 when the voltage at node N2 plus the forward voltage of the diode is greater than the voltage at Vss 215. For a negative potential at node N2 relative to Vss 215 less the forward voltage, current flows from Vss to node N2 and the node N2 voltage equals Vss 215 (less the forward voltage). Thus, for a negative potential (e.g., due to an ESD event) at node N2, the antenna diode 435 roughly holds the node N2 voltage at Vss minus the forward drop.

However, for a positive voltage potential at node N2 relative to Vss 215 (e.g., due to an ESD event 110 or high input signal), almost no current flows from N2 to Vss 215 and the voltage at N2 remains unchanged. Accordingly, the antenna diode 435 is ineffective in reducing high node N2 voltages relative to Vss 215 (e.g., due to ESD events). In addition, the antenna diode 435 cannot regulate voltages at N2 relative to Vdd 220. While, from the above description, an anti-parallel diode (not shown) relative to diode 435 may seem appropriate, it is insufficient in reducing node N2 voltages for protecting nMOS devices in small scale processes (e.g., 65 nm and below).

In order to mitigate the effect of high voltage at node N2, an input terminal (e.g., 405B) corresponding to a floating device 430 is coupled to node N2 for receiving the input signal. In one embodiment, the floating device 430 is an nMOS in the middle of the NAND 404 nMOS stack. For example, terminal 405B which corresponds to the gate of middle nMOS B of the 3-nMOS stack and the gate of complementary pMOS B in FIG. 4B is coupled to node N2. The terminals corresponding to the remaining nMOSs in the stack and their complementary pMOSs are coupled to the tie-high 410 output 415 at node N7.

According to the embodiment in FIG. 4B, during normal operation pMOS A and C are "OFF" and nMOS A and C are "ON" due to the "high" (e.g., Vdd 220) output 415 of the tie-high 410. In terms of the gate of an nMOS device (e.g., nMOS A and/or nMOS B) coupled to the tie-high output 415, the tie-high 410 provides a direct current (DC) bias during steady state that drives the gate high. Thus, as shown in the abbreviated Negated-AND, $\overline{A+B+C}$, truth table (Table 1), for a signal (e.g., X) on input terminal 210, NAND 404 outputs an inverted version (e.g., $\overline{X}$) of the signal.

TABLE 1

| 405A | 405C | 405B | 301D |
|---|---|---|---|
| 1 | 1 | X = 0 | $\overline{X}$ = 1 |
| 1 | 1 | X = 1 | $\overline{X}$ = 0 |

However, as opposed to a direct coupling of Vdd 220 to node N7 for driving the gate high, the output 415 of the tie-high 401 results from a high impedance capacitive coupling of M411 and M412 between the high and low sources, Vdd 220 and Vss 215, within the local power domain. During ESD events 110, the capacitive load on N7 drives N7 low and causes the remaining nMOSs (e.g., nMOS A and nMOS C via 405A and 405C) in the stack to transition to the OFF state, which allows device 430 to float. In terms of the gate of an nMOS device (e.g., nMOS A and/or nMOS B) coupled to the tie-high output 415, the high impedance capacitive coupling provides a "low" direct current (DC) bias during ESD events 110 and, in effect, allows gate voltage of the nMOS to fluctuate with voltage changes on its drain and/or source. In other words, as the drain and/or source fluctuate or "float" with their input voltage, the gate voltage rises or falls with the voltage change to reduce the gate-source or gate-drain voltage potential, therefore preventing damage of the gate oxide. Additionally, the voltage changes are capacitively divided between additional coupled devices (e.g., between both nMOS A and nMOS C) which further reduces oxide stress of those devices. In one embodiment, for example, a 5-NAND with five stacked nMOS gates may be configured with the middle gate coupled to node N2 and the outside gates coupled to the tie-high output 415.

In the configuration shown in FIG. 4B, nMOS B is coupled between two floating terminals of nMOS A and nMOS C, and hence, the drain and source terminals of nMOSB themselves are floating as neither are coupled directly to Vdd 220 or Vss 215. The benefit of such a configuration is twofold. Should node N2 impart a voltage change at the gate of nMOS B, the coupling of the drain and source of nMOS B to floating terminals in the nMOS stack allows the drain and/or source terminal voltages of nMOS B to float up or down with the change in gate voltage and protect its gate oxide. Similarly, should the floating device 430 impart a voltage change at a terminal of nMOS A or nMOS C, the tie-high 410 allows their gate voltage to float up or down and protect their gate oxides from damage.

Figure 5A:
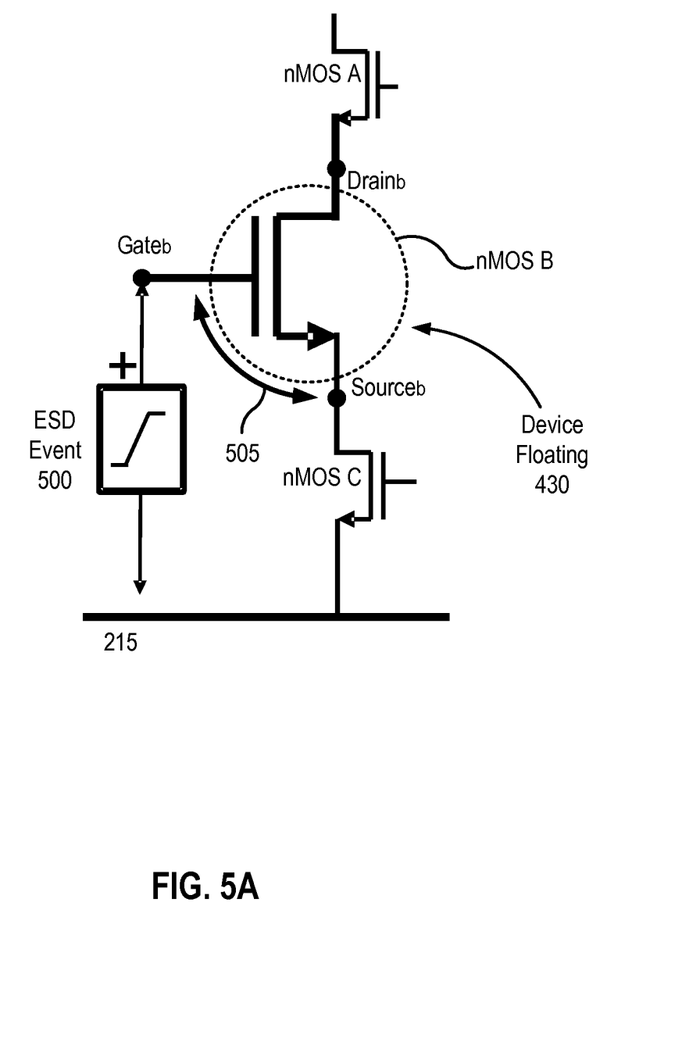
FIG. 5A is a circuit diagram illustrating an example ESD event intercepted at a floating device according to one embodiment.

FIG. 5A is a circuit diagram illustrating an example ESD event 500 intercepted at a floating device 430 according to one embodiment. As shown, the example ESD event 500 causes a potential difference at Gateb of nMOS B relative to Vss 215. The difference in voltage potential 505 across the oxide due to the ESD event 500 is measured from the Gateb terminal to the Sourceb terminal (Vgs) of nMOS B.

Figure 5B:
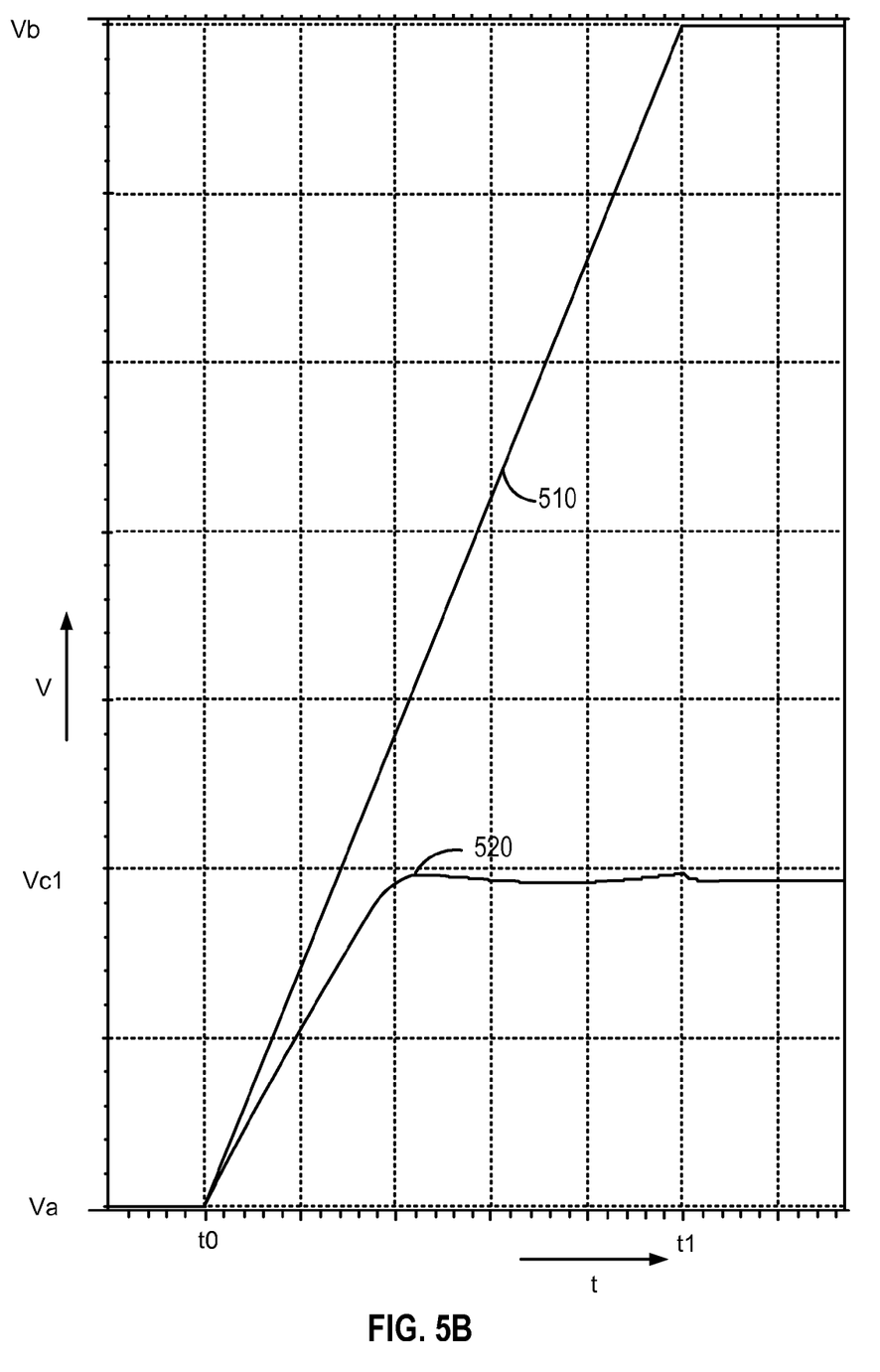
FIG. 5B is a diagram illustrating voltage rise due to an ESD event intercepted at a floating device according to one embodiment.

FIG. 5B is a diagram illustrating voltage rise due to an ESD event 500 intercepted at a floating device 430 according to one embodiment. Line 510 represents a voltage trace of a non-floating nMOS transistor (e.g., M324) and line 520 represents a voltage trace of a floating device 430 (e.g., nMOS B). Both traces 510, 520 are measured across the oxide of the device. In one embodiment, the diagram illustrates a Vgs voltage potential 505 measurement for a Va to Vb impulse rise (e.g., 0V to 7V) over t0 to t1 (e.g., 0 ns to 1 ns) on the gate of each device M324, nMOS B.

As shown, the Vgs voltage trace 510 for the non-floating device rises from Va to Vb with the increase in gate voltage from Va to Vb. As the Vgs voltage 510 increases, the gate oxide may degrade and fail.

In contrast, the Vgs voltage trace 520 for the floating device 430 rises from Va and levels off at Vc1 with the increase in gate voltage from Va to Vb. Consider the floating device nMOS B illustrated in FIG. 5A. The leveling off results from sourceb of nMOS B increasing in voltage or "floating up" with the voltage increase on gateb to a maximum Vgs potential difference of Vc1. Lowering the voltage across the oxide to the leveling off voltage Vc1 makes the device more resilient to ESD failure.

Figure 6A:
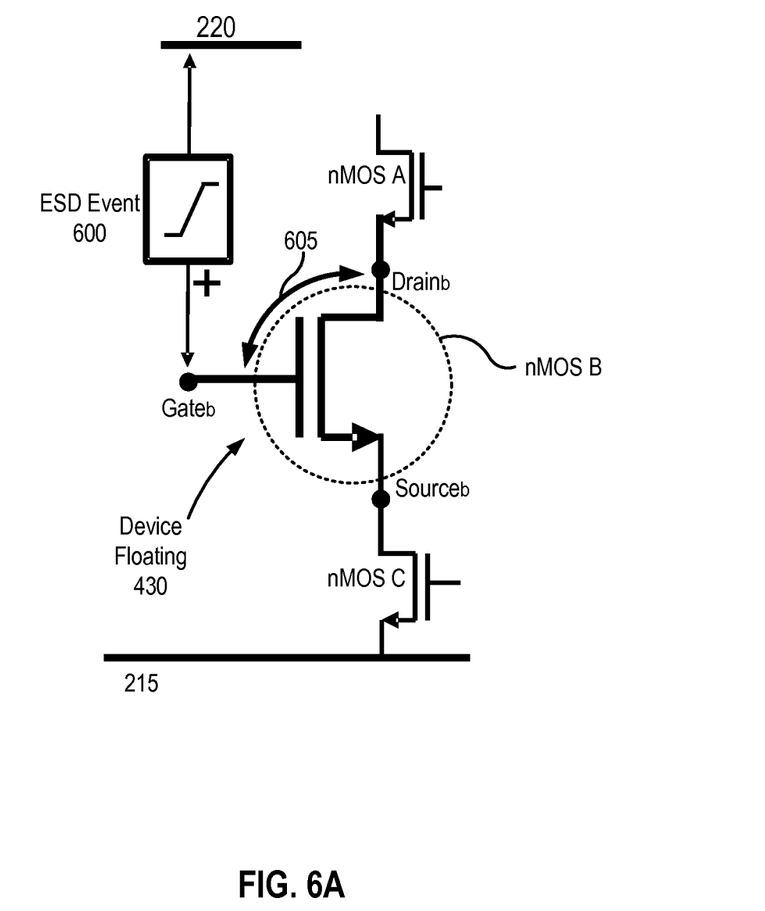
FIG. 6A is a circuit diagram illustrating an example ESD event intercepted at a floating device according to one embodiment.

FIG. 6A is a circuit diagram illustrating an example ESD event 600 intercepted at a floating device 430 according to one embodiment. As shown, the example ESD event 600 causes a potential difference at Gateb of nMOS B relative to Vdd 220. The difference in voltage potential 605 across the oxide due to the ESD event 500 is measured from the Gateb terminal to the Drainb terminal (Vgd) of nMOS B.

Figure 6B:
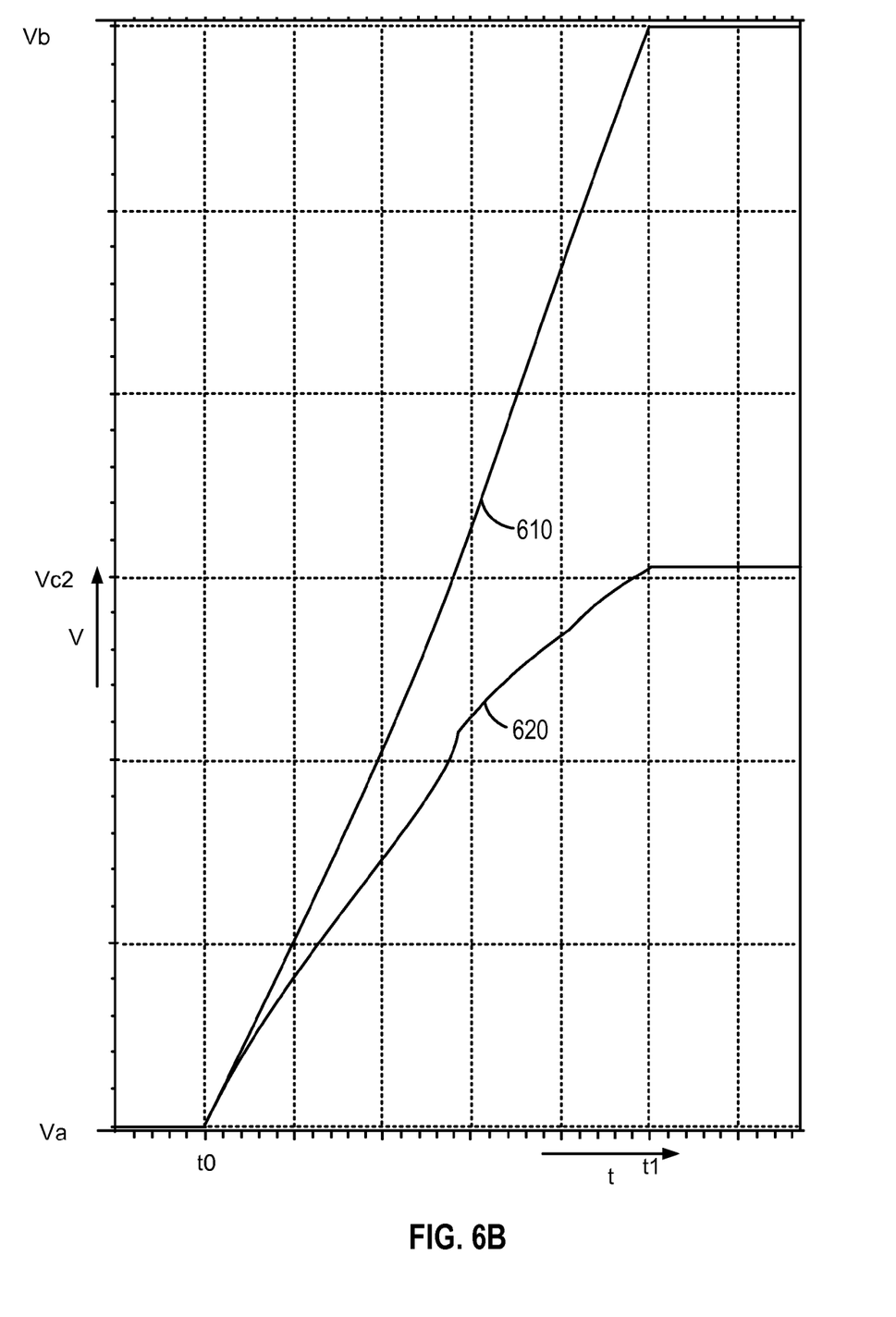
FIG. 6B is a diagram illustrating voltage rise due to an ESD event intercepted at a floating device according to one embodiment.

FIG. 6B is a diagram illustrating voltage rise due to an ESD event 600 intercepted at a floating device 430, according to one embodiment. In one embodiment, line 610 represents a voltage trace of a non-floating nMOS transistor (e.g., M324) and line 620 represents a voltage trace of a floating device 430

(e.g., nMOS B). Both traces 610, 620 are measured across the oxide of the device. In one embodiment, the diagram illustrates a Vgd voltage potential 605 measurement for a Va to Vb impulse rise (e.g., 0V to 7V) over t0 to t1 (e.g., 0 ns to 1 ns) on the gate of each device M324, nMOS B.

As shown, the Vgd voltage trace 610 for the non-floating device rises from Va to Vb with the increase in gate voltage from Va to Vb. As the Vgs voltage 610 increases, the gate oxide may degrade and fail.

In contrast, the Vgd voltage trace 620 for the floating device 430 rises from Va and levels off at Vc2 with the increase in gate voltage from Va to Vb. Consider the floating device nMOS B illustrated in FIG. 6A. The leveling off results from drainb of nMOS B increasing in voltage or "floating up" with the voltage increase on gateb to a maximum Vgd potential difference of Vc2. Lowering the voltage across the oxide to the leveling off voltage Vc2 makes the device more resilient to ESD failure.

Figure 7:
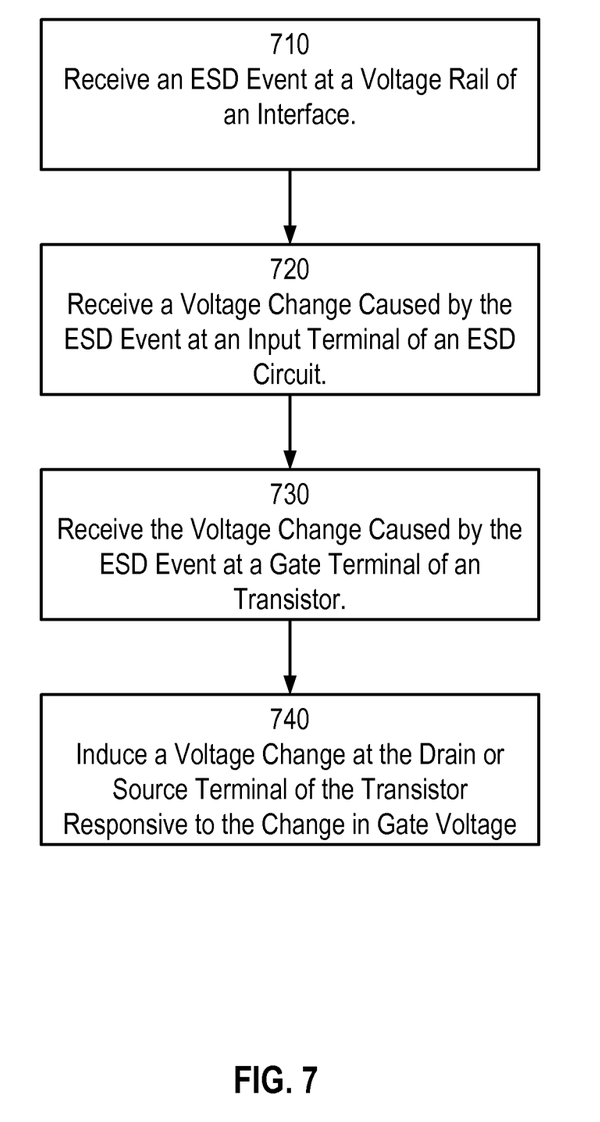
FIG. 7 is a flowchart illustrating a method of preventing device failure on a system-on-chip from an ESD event using a floating device, according to one embodiment.

FIG. 7 is a flowchart illustrating a method of preventing device failure on a SoC 100 from an ESD event using a floating device 430, according to one embodiment. First, an interface 101 of the SoC 100 receives 710 an ESD Event at a voltage rail (e.g., Vdd1 221) of the interface 101. The interface 101 causes a voltage change at its output 230 due to the ESD event.

An ESD circuit 205 receives 720 the voltage change caused by the ESD event at its input terminal 237. The input terminal 237 is coupled to the gate terminal of a transistor floating device 430. The gate terminal of the floating device 430 receives 730 the voltage change caused by the ESD event.

In response to the change in voltage at the gate terminal, the ESD circuit 205 induces 740 a voltage change at the drain and/or source terminal of the transistor to prevent damage to the gate oxide. The induced voltage at the drain and/or source terminal lowers their voltage potential (across the oxide) relative to the gate and thus mitigates oxide stress from voltage changes due to the ESD event.

Upon reading this disclosure, those of ordinary skill in the art will appreciate still additional alternative structural and functional designs through the disclosed principles of the embodiments. Thus, while particular embodiments and applications have been illustrated and described, it is to be understood that the embodiments are not limited to the precise construction and components disclosed herein and that various modifications, changes and variations which will be apparent to those skilled in the art may be made in the arrangement, operation and details of the method and apparatus disclosed herein without departing from the spirit and scope as defined in the appended claims.

What is claimed is:

1. An electrostatic discharge (ESD) device, comprising:
 a first standard cell component coupled to first voltage rails of a first power domain, the first standard cell component comprising:
  a first transistor and a second transistor,
  a floating device coupled in series between the first transistor and the second transistor,
  a first input terminal operatively coupling a gate terminal of the floating device to an output terminal of a component coupled to second voltage rails of a second power domain, and
  a second input terminal coupled to gate terminals of the first transistor and the second transistor; and
 a second standard cell component coupled to the first voltage rails of the first power domain and comprising an output terminal of the second standard cell component coupled to the second input terminal to enable change of drain voltage or source voltage of the floating device in response to a change in voltage at the output of the component coupled to the second voltage rails.

2. The ESD device of claim 1, wherein at least one of the drain voltage and the source voltage of the floating device increases in response to an increase in voltage at the output of the component coupled to the second voltage rails.

3. The ESD device of claim 1, wherein at least one of the drain voltage and the source voltage of the floating device decreases in response to a decrease in voltage at the output of the component coupled to the second voltage rails.

4. The ESD device of claim 1, wherein the first standard cell component further comprises a third input terminal coupling the floating device to the output terminal of the second standard cell component.

5. The ESD device of claim 1, wherein the first standard cell component and the second standard cell component are instantiated during a design stage of the ESD device by retrieving information from a standard cell library.

6. The ESD device of claim 1, wherein the component coupled to the second voltage rails receives an ESD event via a second voltage rail and causes a change in voltage at the gate terminal of the floating device of the first standard cell component, the drain voltage or the source voltage of the floating device increasing or decreasing to reduce a potential difference between the gate terminal and a drain terminal or a source terminal of the floating device.

7. The ESD device of claim 1, wherein the first standard cell component is a NAND logic with at least three input terminals.

8. The ESD device of claim 1, wherein the first transistor has a drain terminal coupled to an output terminal of the first standard cell component, and a source terminal coupled to a drain terminal of the floating device, and wherein the second transistor has a drain terminal coupled to a source terminal of the floating device, and a source terminal coupled to a negative supply of the first voltage rails.

9. The ESD device of claim 1, wherein the second standard cell component further comprises:
 a p-type metal-oxide-semiconductor field-effect transistor (pMOS) having a gate terminal, a drain terminal coupled to the output terminal of the second standard cell component, and a source terminal coupled to a positive supply rail of the first voltage rails; and
 a n-type metal-oxide-semiconductor field-effect transistor (nMOS) having a gate terminal coupled to the gate terminal of the pMOS, a drain terminal coupled to the gate terminal of the pMOS, and a source terminal coupled to a negative supply rail of the first voltage rails.

10. An electronic device including an electrostatic discharge (ESD) device, the electronic device comprising:
 a first standard cell component coupled to first voltage rails of a first power domain of the electronic device, the first standard cell component comprising:
  a first transistor and a second transistor,
  a floating device coupled in series between the first transistor and the second transistor,
  a first input terminal operatively coupling a gate terminal of the floating device to an output terminal of a component coupled to second voltage rails of a second power domain of the electronic device, and
  a second input terminal coupled to the gate terminals of the first transistor and the second transistor; and
 a second standard cell component coupled to the first voltage rails of the first power domain of the electronic device and comprising an output terminal of the second standard cell component coupled to the second input terminal to enable change of drain voltage or source voltage of the floating device in response to a change in voltage at the output of the component coupled to the second voltage rails.

11. The electronic device of claim 10, wherein at least one of the drain voltage and the source voltage of the floating device increases in response to an increase in voltage at the output of the component coupled to the second voltage rails.

12. The electronic device of claim 10, wherein at least one of the drain voltage and the source voltage of the floating device decreases in response to a decrease in voltage at the output of the component coupled to the second voltage rails.

13. The electronic device of claim 10, wherein the first standard cell component further comprises a third input terminal coupling the floating device to the output terminal of the second standard cell component.

14. The electronic device of claim 10, wherein the first standard cell component and the second standard cell component are instantiated during a design stage of the ESD device by retrieving information from a standard cell library.

15. The electronic device of claim 10, wherein the component coupled to the second voltage rails receives an ESD event via a second voltage rail and causes a change in voltage at the gate terminal of the floating device of the first standard cell component, the drain voltage or the source voltage of the floating device increasing or decreasing to reduce a potential difference between the gate terminal and a drain terminal or a source terminal of the floating device.

16. The electronic device of claim 10, wherein the first standard cell component is a NAND logic with at least three input terminals.

17. The electronic device of claim 11, wherein the first transistor has a drain terminal coupled to an output terminal of the first standard cell component, and a source terminal coupled to a drain terminal of the floating device, and wherein the second transistor has a drain terminal coupled to a source terminal of the floating device, and a source terminal coupled to a negative supply of the first voltage rails.

18. The electronic device of claim 10, wherein the second standard cell component further comprises:
a p-type metal-oxide-semiconductor field-effect transistor (pMOS) having a gate terminal, a drain terminal coupled to the output terminal of the second standard cell component, and a source terminal coupled to a positive supply rail of the first voltage rails; and
a n-type metal-oxide-semiconductor field-effect transistor (nMOS) having a gate terminal coupled to the gate terminal of the pMOS, a drain terminal coupled to the gate terminal of the pMOS, and a source terminal coupled to a negative supply rail of the first voltage rails.

19. A method of preventing failure of an integrated circuit from an electrostatic discharge (ESD) event, the method comprising:
receiving a first voltage change caused by the ESD event at a first voltage rail of an interface within a first power domain, the first power domain having at least one component powered by the first voltage rail;
receiving a second voltage change caused by the ESD event at a gate terminal of a floating device within a second power domain, the second power domain having a first transistor and a second transistor powered by a second voltage rail, the floating device coupled between the first transistor and the second transistor; and
in response to the second voltage change at the gate terminal of the floating device, inducing a third voltage change at a second terminal of the floating device by switching off the first transistor and the second transistor to reduce a voltage potential between the gate terminal and the second terminal.

20. The method of claim 19, wherein the reduced voltage potential between the gate terminal and the second terminal is across a gate oxide of a transistor susceptible to a voltage change due to the ESD event.

21. The method of claim 19, wherein the reduced voltage potential between the gate terminal and the second terminal is from the gate terminal to a drain terminal or source terminal of the floating device.

22. The method of claim 19, wherein the first voltage change caused by the ESD event is conducted from the first voltage rail by the interface within the first power domain.

23. The method of claim 19, wherein the third voltage change induced at the second terminal increases in response to an increase in the second voltage change at the gate terminal.

24. The method of claim 19, wherein the third voltage change induced at the second terminal decreases in response to a decrease in the second voltage change at the gate terminal.

25. The method of claim 19, wherein the floating device is included in a component instantiated using a standard cell.

* * * * *